US009495285B2

(12) United States Patent
Hsu et al.

(10) Patent No.: US 9,495,285 B2
(45) Date of Patent: Nov. 15, 2016

(54) INITIATING OPERATION OF A TIMING DEVICE USING A READ ONLY MEMORY (ROM) OR A ONE TIME PROGRAMMABLE NON VOLATILE MEMORY (OTP NVM)

(71) Applicant: Integrated Device Technology, Inc., San Jose, CA (US)

(72) Inventors: John Hsu, Sunnyvale, CA (US); Hui Li, Fremont, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 174 days.

(21) Appl. No.: 14/488,262

(22) Filed: Sep. 16, 2014

(65) Prior Publication Data

US 2016/0077958 A1 Mar. 17, 2016

(51) Int. Cl.
| | | |
|---|---|---|
| G06F 1/00 | (2006.01) | |
| G06F 12/02 | (2006.01) | |
| G06F 12/06 | (2006.01) | |
| G11C 7/20 | (2006.01) | |
| G11C 11/413 | (2006.01) | |
| G11C 11/00 | (2006.01) | |

(52) U.S. Cl.
CPC ....... *G06F 12/0238* (2013.01); *G06F 12/0638* (2013.01); *G11C 7/20* (2013.01); *G11C 11/005* (2013.01); *G11C 11/413* (2013.01); *G06F 2212/202* (2013.01)

(58) Field of Classification Search
CPC ............... G06F 12/0238; G06F 2212/202; G06F 13/1689
See application file for complete search history.

(56) References Cited

U.S. PATENT DOCUMENTS

| | | | |
|---|---|---|---|
| 4,862,485 A | 8/1989 | Guinea et al. | |
| 5,663,105 A | 9/1997 | Yu et al. | |
| 5,748,949 A | 5/1998 | Johnston et al. | |
| 5,757,240 A | 5/1998 | Boerstler et al. | |
| 5,903,195 A | 5/1999 | Lukes et al. | |
| 6,219,797 B1 * | 4/2001 | Liu ........................... | G06F 1/08 713/322 |
| 6,259,327 B1 | 7/2001 | Balistreri et al. | |
| 6,640,311 B1 | 10/2003 | Knowles et al. | |

(Continued)

OTHER PUBLICATIONS

"19-Output PCIE GEN 3 Buffer", Si53019-A01A, Silicon Laboratories Inc., Rev. 1.1 May 2015, 34 Pages.

(Continued)

*Primary Examiner* — Jaweed A Abbaszadeh
*Assistant Examiner* — Austin Hicks
(74) *Attorney, Agent, or Firm* — Glass & Associates; Kenneth Glass

(57) ABSTRACT

The present invention provides a method and a programmable timing device that includes a timing device circuit for generating at least one timing signal, a static random access memory (SRAM) coupled to the timing device circuit, a read only memory (ROM) having a first timing device configuration stored therein, a one time programmable non volatile memory (OTP NVM) for storing a second timing device configuration and selection logic. The selection logic includes an output coupled to the SRAM, a first input coupled to the ROM and a second input coupled to the OTP NVM. The selection logic is operable to receive input indicating whether SRAM is to be loaded from the ROM or the OTP NVM, and operable to load either the first timing device configuration from the ROM or the second timing device configuration from the OTP NVM based on the input.

20 Claims, 7 Drawing Sheets

(56) References Cited

U.S. PATENT DOCUMENTS

| | | |
|---|---|---|
| 6,643,787 B1 | 11/2003 | Zerbe et al. |
| 6,650,193 B2 | 11/2003 | Endo et al. |
| 6,683,506 B2 | 1/2004 | Ye et al. |
| 6,727,767 B2 | 4/2004 | Takada et al. |
| 6,768,387 B1 | 7/2004 | Masuda et al. |
| 6,959,066 B2 | 10/2005 | Wang et al. |
| 7,012,476 B2 | 3/2006 | Ogiso et al. |
| 7,323,916 B1 | 1/2008 | Sidiropoulos et al. |
| 7,405,594 B1 | 7/2008 | Xu et al. |
| 7,434,083 B1 | 10/2008 | Wilson et al. |
| 7,541,848 B1 | 6/2009 | Masuda et al. |
| 7,545,188 B1 | 6/2009 | Xu et al. |
| 7,573,303 B1 | 8/2009 | Chi et al. |
| 7,586,347 B1 | 9/2009 | Ren et al. |
| 7,590,163 B1 | 9/2009 | Miller et al. |
| 7,671,635 B2 | 3/2010 | Fan et al. |
| 7,737,739 B1 | 6/2010 | Bi et al. |
| 7,741,981 B1 | 6/2010 | Wan et al. |
| 7,750,618 B1 | 7/2010 | Fang et al. |
| 7,786,763 B1 | 8/2010 | Bal et al. |
| 7,816,959 B1 | 10/2010 | Isik et al. |
| 7,907,625 B1 | 3/2011 | MacAdam et al. |
| 7,928,880 B2 | 4/2011 | Tsukamoto |
| 7,941,723 B1 | 5/2011 | Lien et al. |
| 8,018,289 B1 | 9/2011 | Hu et al. |
| 8,164,367 B1 | 4/2012 | Bal et al. |
| 8,179,952 B2 | 5/2012 | Thurston et al. |
| 8,188,796 B2 | 5/2012 | Zhu et al. |
| 8,259,888 B2 | 9/2012 | Hua et al. |
| 8,284,816 B1 | 10/2012 | Clementi et al. |
| 8,305,154 B1 | 11/2012 | Kubena et al. |
| 8,416,107 B1 | 4/2013 | Wan et al. |
| 8,432,231 B2 | 4/2013 | Zhu et al. |
| 8,436,677 B2 | 5/2013 | Kull et al. |
| 8,456,155 B2 | 6/2013 | Tamura |
| 8,471,751 B2 | 6/2013 | Wang |
| 8,537,952 B1 | 9/2013 | Arora et al. |
| 8,693,557 B1 | 4/2014 | Zhang et al. |
| 8,704,564 B2 | 4/2014 | Hasegawa et al. |
| 8,723,573 B1 | 5/2014 | Wang et al. |
| 8,791,763 B1 | 7/2014 | Taghivand |
| 8,896,476 B2 | 11/2014 | Harpe |
| 8,933,830 B1 | 1/2015 | Jeon |
| 8,981,858 B1 | 3/2015 | Grivna et al. |
| 9,077,386 B1 | 7/2015 | Holden et al. |
| 9,100,232 B1 | 8/2015 | Hormati et al. |
| 2002/0079937 A1 | 6/2002 | Xanthopoulos et al. |
| 2002/0191727 A1 | 12/2002 | Staszewski et al. |
| 2003/0042985 A1 | 3/2003 | Shibahara et al. |
| 2003/0184350 A1 | 10/2003 | Wang et al. |
| 2004/0136440 A1 | 7/2004 | Miyata et al. |
| 2004/0165691 A1 | 8/2004 | Rana et al. |
| 2006/0119402 A1 | 6/2006 | Thomsen et al. |
| 2006/0197614 A1 | 9/2006 | Roubadia et al. |
| 2006/0290391 A1 | 12/2006 | Leung et al. |
| 2007/0149144 A1 | 6/2007 | Beyer et al. |
| 2007/0247248 A1 | 10/2007 | Kobayashi et al. |
| 2008/0043893 A1 | 2/2008 | Nagaraj et al. |
| 2008/0104435 A1 | 5/2008 | Pernia et al. |
| 2008/0129351 A1 | 6/2008 | Chawla et al. |
| 2008/0246546 A1 | 10/2008 | Ha et al. |
| 2009/0083567 A1 | 3/2009 | Kim et al. |
| 2009/0140896 A1 | 6/2009 | Adduci et al. |
| 2009/0184857 A1 | 7/2009 | Furuta et al. |
| 2009/0231901 A1 | 9/2009 | Kim et al. |
| 2009/0256601 A1 | 10/2009 | Zhang et al. |
| 2009/0262567 A1 | 10/2009 | Shin et al. |
| 2010/0007427 A1 | 1/2010 | Tomita et al. |
| 2010/0052798 A1 | 3/2010 | Hirai et al. |
| 2010/0090731 A1 | 4/2010 | Casagrande et al. |
| 2010/0164761 A1 | 7/2010 | Wan et al. |
| 2010/0194483 A1 | 8/2010 | Storaska et al. |
| 2010/0323643 A1 | 12/2010 | Ridgers et al. |
| 2011/0006936 A1 | 1/2011 | Lin et al. |
| 2011/0032013 A1 | 2/2011 | Nelson et al. |
| 2011/0234204 A1 | 9/2011 | Tamura et al. |
| 2011/0234433 A1 | 9/2011 | Aruga et al. |
| 2011/0285575 A1 | 11/2011 | Landez et al. |
| 2011/0304490 A1 | 12/2011 | Janakiraman |
| 2012/0013406 A1 | 1/2012 | Zhu et al. |
| 2012/0161829 A1 | 6/2012 | Fernald et al. |
| 2012/0200330 A1 | 8/2012 | Kawagoe et al. |
| 2012/0262315 A1 | 10/2012 | Kapusta et al. |
| 2012/0297231 A1* | 11/2012 | Qawami .................. G06F 1/12 713/400 |
| 2012/0317365 A1 | 12/2012 | Elhamias et al. |
| 2012/0328052 A1 | 12/2012 | Etemadi et al. |
| 2013/0002467 A1 | 1/2013 | Wang |
| 2013/0162454 A1 | 6/2013 | Lin |
| 2013/0194115 A1 | 8/2013 | Wu et al. |
| 2013/0211758 A1 | 8/2013 | Prathapan et al. |
| 2014/0029646 A1 | 1/2014 | Foxcroft et al. |
| 2014/0210532 A1 | 7/2014 | Jenkins et al. |
| 2014/0327478 A1 | 11/2014 | Horng et al. |
| 2014/0347941 A1 | 11/2014 | Jose et al. |
| 2015/0162921 A1 | 6/2015 | Chen et al. |
| 2015/0180594 A1 | 6/2015 | Chakraborty et al. |
| 2015/0200649 A1 | 7/2015 | Trager et al. |
| 2016/0084895 A1 | 3/2016 | Imhof |
| 2016/0119118 A1 | 4/2016 | Shokrollahi |
| 2016/0162426 A1 | 6/2016 | Benjamin et al. |
| 2016/0211929 A1 | 7/2016 | Holden et al. |

OTHER PUBLICATIONS

"NB3W1200L: 33 V 100/133 MHz Differential 1:12 Push-Pull Clock ZDB/Fanout Buffer for PCIe", ON Semiconductor, http://onsemi.com, Aug. 2013, Rev. 0, 26 Pages.

Avramov, et al., "1.5-GHz Voltage Controlled Oscillator with 3% Tuning Bandwidth Using a Two-Pole DSBAR Filter", Ultrasonics, Ferroelectrics and Frequency Control. IEEE Transactions on. vol. 58., May 2011, pp. 916-923.

Hwang, et al., "A Digitally Controlled Phase-Locked Loop with a Digital Ohase—Frequency Detector for Fast Acquisition", IEEE Journal of Solid State Circuits, vol. 36, No. 10, Oct. 2001, pp. 1574-1581.

Kratyuk, et al., "Frequency Detector for Fast Frequency Lock of Digital PLLs", Electronic Letters, vol. 43, No. 1, Jan. 4, 2007, pp. 1-2.

Mansuri, "Fast Frequency Acquisition Phase-Frequency Detectors for GSamples/s Phase-Locked Loops", IEEE Journal of Solid-State Circuits, vol. 37 No. 10, Oct. 2002, pp. 1331-1334.

Niagaraju, "A Low Noise 1.5GHz VCO with a 3.75% Tuning Range Using Coupled FBAR's", IEEE International Ultrasonics Symposium (IUS), Oct. 2012, pp. 1-4.

Watanabe, "An All-Digital PLL for Frequency Multiplication by 4 to 1022 with Seven-Cycle Lock Time", IEEE Journal of Solid-State Circuits, vol. 39 No. 2, Feb. 2003, pp. 198-204.

Texas Instruments "CDCEx913 Programmable 1-PLL VCXO Clock Synthesizer With 1.8-V, 2.5-V, and 3.3-V Outputs", Apr. 2015, pp. 1-36, pp. 11, 20-22.

* cited by examiner

US 9,495,285 B2

INITIATING OPERATION OF A TIMING DEVICE USING A READ ONLY MEMORY (ROM) OR A ONE TIME PROGRAMMABLE NON VOLATILE MEMORY (OTP NVM)

BACKGROUND OF THE INVENTION

Programmable timing devices must have a basic set of configuration parameters at each power-on of the timing device in order to generate the required timing device output. Typically, at a power-on of a programmable timing device, typically referred to as a "power-on reset," the timing device receives a configuration at data interface control circuits of the timing device such as an Inter-IC (I²C) interface or a system management bus (SMB) interface. This configuration is loaded into the timing device and is used to control the initial operation of the timing device.

In order to eliminate the need for receiving configuration data at each power-on reset, timing devices have been developed that are configured to be connected to external read only memory (ROM) that includes the required timing device configuration. At power-on reset the timing device configuration from the external ROM is loaded into the timing device to control the initial operation of the timing device.

Though use of a timing device configuration stored in an external ROM eliminates the need to program a configuration into the timing device through the data interface control circuits at each power-on reset, there may be a need to use a different configuration from the timing device configuration stored in the external ROM. Accordingly, there is a need for a method and apparatus that will allow for more flexibility in the configuration of the timing device and that will not require that the timing device receive a configuration through the data interface control circuits after each power-on reset.

SUMMARY OF THE INVENTION

The present invention provides a timing device that includes a timing device circuit for generating at least one timing signal, a static random access memory (SRAM) coupled to the timing device circuit, a read only memory (ROM) having a first timing device configuration stored therein, a one time programmable non volatile memory (OTP NVM) for storing a second timing device configuration and selection logic. The selection logic has an output coupled to the SRAM, a first input coupled to the ROM and a second input coupled to the OTP NVM. The selection logic is operable to receive input indicating whether SRAM is to be loaded from the ROM or the OTP NVM, and is operable to load either the first timing device configuration from the ROM or the second timing device configuration from the OTP NVM based on the input.

In one embodiment the timing device includes a timing device circuit for generating at least one timing signal, a mask ROM having a first timing device configuration stored therein, a OTP NVM for storing a second timing device configuration, and a SRAM coupled to the timing device circuit, the ROM, the OTP NVM and the configuration select input. The SRAM includes a SRAM array and a memory controller that is coupled to the SRAM array. The memory controller is operable to receive input indicating whether the SRAM is to be loaded from the ROM or the OTP NVM and is operable to load either the first timing device configuration from the ROM or the second timing device configuration from the OTP NVM into the SRAM memory array based on the input.

A method is disclosed that includes receiving an input at a timing device, the input indicating either ROM is to be loaded or OPT NVM is to be loaded into a SRAM of the timing device, storing a first timing device configuration in a ROM of the timing device and loading the first timing device configuration from the ROM into a SRAM of the timing device when the input indicates ROM is to be loaded. When a second timing device configuration is stored in a OTP NVM of the timing device and when the input indicates OTP NVM is to be loaded, the second timing device configuration is loaded from the OTP NVM into the SRAM, where the second timing device configuration is different from the first timing device configuration. The method further includes starting timing device operations using the loaded timing device configuration to generate output timing signals.

The methods and apparatus of the present invention allow for loading a configuration from either ROM or OTP NVM, providing the user of the timing device added flexibility as compared to timing devices that only allow for loading a timing device configuration from ROM and timing devices that only allow for loading of timing device configurations received at data interface control circuits.

DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
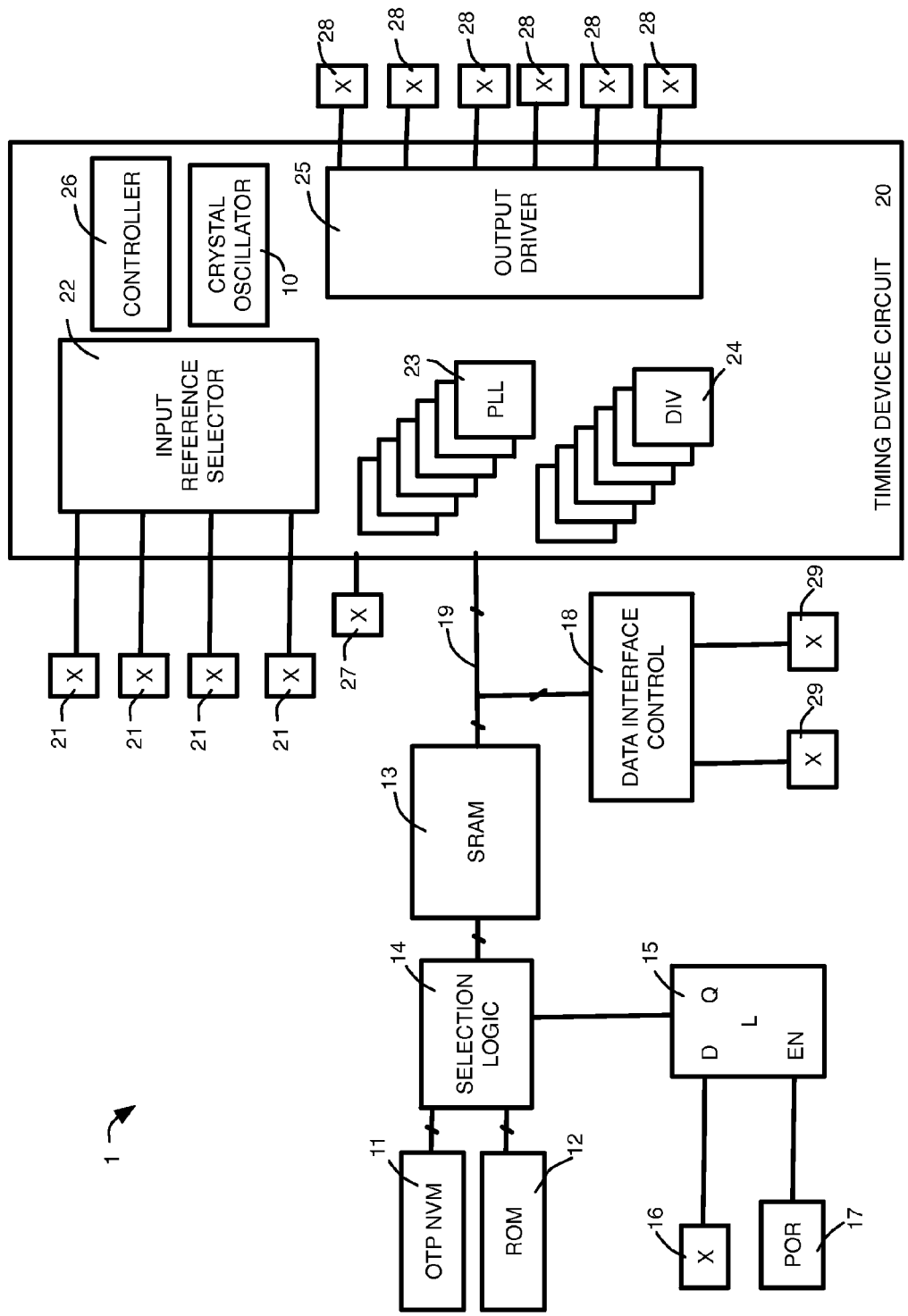
FIG. 1 is an illustration of a timing device in accordance with an embodiment of the present invention.

FIG. 1 shows a timing device 1 that includes a timing device circuit 20 for generating timing signals at timing device outputs 28. Timing device 1 also includes inputs 29 that are coupled to a data interface control circuit 18 for providing external input to timing device 1. Data interface control circuit 18 is coupled to SRAM 13 and to timing device circuit 20 by internal data bus 19. Data interface control circuit 18 can be an Inter-IC (I$^2$C) interface or a system management bus (SMB) interface that allows for coupling data to timing device 1 via inputs 29.

Timing device 1 includes one time programmable non volatile memory (OTP NVM) 11 and read only memory (ROM) 12 that are coupled to a static random access memory (SRAM) 13 by selection logic 14. More particularly, selection logic 14 has a first input coupled to ROM 12, a second input coupled to the OTP NVM 11, and an output couple to SRAM 13. Latch 15 is coupled to a configuration select input 16 and a power on reset input 17 and has an output coupled to selection logic 14. In the present embodiment ROM 12 is directly connected to selection logic 14 by one or more electrical pathway of timing device 2 such as one or more interconnect between the circuitry of ROM 12 and selection logic 14. Similarly, OTP NVM 11 is directly connected to selection logic 14 by one or more electrical pathway of timing device 2 such as one or more interconnect between the circuitry of ROM 12 and selection logic 14. In this embodiment one or more interconnect between selection logic 14 and SRAM 13 electrically connect the circuitry of selection logic 14 to the circuitry of SRAM 13.

Continuing with FIG. 1, a first timing device configuration is stored in ROM 12. In the present embodiment ROM 12 is a mask ROM with a default configuration stored in the mask ROM before timing device 1 is shipped to the customer.

OTP NVM allows the customer to store their own timing device configuration that can be used to control the operations of timing device 1 at power-on-reset of timing device 1. In the present embodiment OTP NVM is a non-volatile memory array that includes programmable fuses and/or antifuses that can be programmed for one-time-storage in the OTP NVM memory array. In the present embodiment OTP NVM 11 includes programming logic coupled to the programmable fuses that selectively applies a high voltage to the programmable fuses during programming so as to "burn" the data into OTP NVM 11, storing a second timing device configuration in OTP NVM 11, that can be referred to hereinafter as a "programmed timing device configuration."

Selection logic 14 is operable to receive input indicating whether SRAM is to be loaded from the ROM or the OTP NVM. In the present embodiment, upon power-up reset, a logical high input is received at power on reset input 17. Input indicating whether the SRAM is to be loaded from the ROM or the OTP NVM is received at configuration select input 16 and is store in latch 15. The input may be, for example, a logical low indicating that SRAM is to be loaded from ROM 12 or a logical high indicating that SRAM is to be loaded from OTP NVM 11.

Selection logic 14 is operable to load either the default timing device configuration from the ROM or the programmed timing device configuration from the OTP NVM based on the input. In the previous example in which a logical low indicates that SRAM is to be loaded from ROM 12 and a logical high indicates that SRAM 13 is to be loaded from OTP NVM 11, if the input received at power on reset input 17 is a logical low SRAM 13 is loaded from ROM 12 and if the input is a logical high, SRAM 13 is loaded from OTP NVM 11.

The timing device configuration loaded into the SRAM, that is referred to hereinafter as the "loaded timing device configuration," will either be the default configuration from ROM 12 or a programmed configuration burned into OTP NVM 11.

Accordingly, the customer can determine which configuration is used at power-on reset by providing input to configuration select input 16. In the event that no input is provided to configuration select input 16, the latch will register a logical low and the default configuration will be loaded into SRAM 13.

In one embodiment selection logic 14 is one or more multiplexer having an output coupled to the data input of the SRAM 13, a first input of the multiplexer(s) coupled to the data output of ROM 12 and a second input of the multiplexer(s) coupled to the data output of OTP NVM 11. In this embodiment the multiplexer(s) is operable to receive the input indicating whether SRAM is to be loaded from the ROM or the OTP NVM and is operable to load either the default timing device configuration from the ROM or the programmed timing device configuration from the OTP NVM based on the input. In the present embodiment, upon power-up reset, a logical high input is received at power on reset input 17. Input indicating whether the SRAM is to be loaded from the ROM or the OTP NVM is received at configuration select input 16 and is store in latch 15. The input may be, for example, a logical low indicating that SRAM is to be loaded from ROM 12 or a logical high indicating that SRAM is to be loaded from OTP NVM 11. If the input received at power on reset input 17 is a logical low, the multiplexer loads SRAM 13 from ROM 12 and if the input is a logical high the multiplexer loads SRAM 13 from OTP NVM 11.

Figure 2:
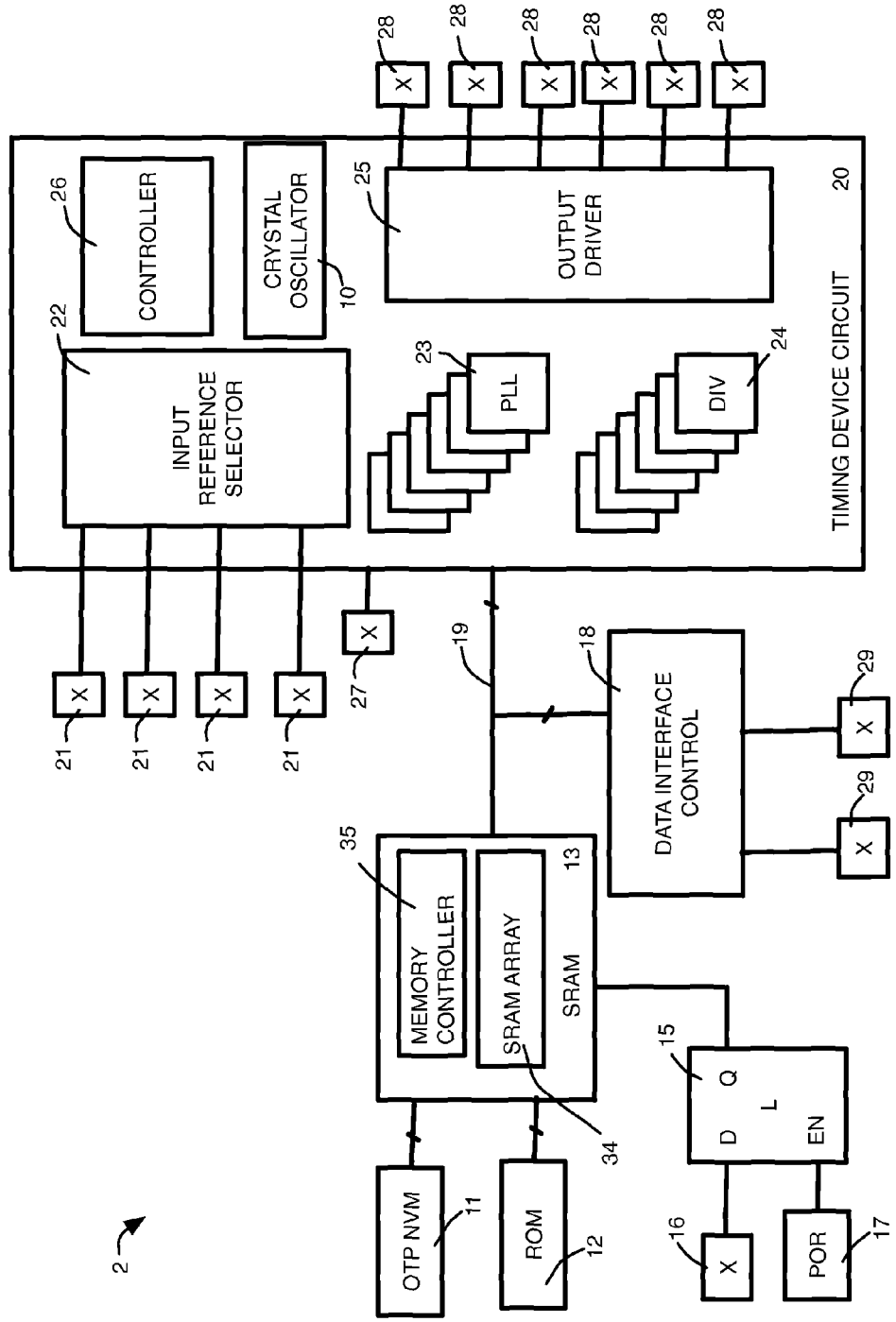
FIG. 2 is a block diagram illustrating a timing device having a SRAM that is coupled to a latch, ROM and to OTP NVM in accordance with an embodiment of the present invention.

In timing device 2 shown in FIG. 2, the output of latch 15 is electrically connected to SRAM 13 and latch 15 is coupled to configuration select input 16 for receiving the input indicating whether SRAM 13 is to be loaded from ROM 12 or OTP NVM 11. In the present embodiment ROM 12 is directly connected to SRAM 13 by one or more electrical pathway of timing device 2 such as one or more interconnect between the circuitry of ROM 12 and memory controller 35 of SRAM 13. Similarly, OTP NVM 11 is directly connected to SRAM 13 by one or more electrical pathway of timing device 2 such as one or more interconnect between the circuitry of ROM 12 and memory controller 35 of SRAM 13.

SRAM 13 includes a memory controller 35 and a SRAM array 34 that are operably coupled together for storing data in SRAM array 34 and reading data from SRAM array 34. Memory controller 35 is operable to receive the input indicating whether SRAM 13 is to be loaded from ROM 12 or OTP NVM 11 and is operable to load either the first timing device configuration from ROM 12 or the second timing device configuration from OTP NVM 11 into SRAM array 34 based on the input.

It is appreciated that ROM 12 and/or OTP NVM 11 could also be coupled to SRAM 15 through data bus 19. In the embodiment shown in FIG. 3, a timing device 3 is shown in which OTP NVM 11 is electrically connected to internal bus 19 and internal bus 19 is electrically connected to SRAM 13 for coupling data from OTP NVM to SRAM 13. In the embodiment shown in FIG. 4, a timing device 4 is shown in which both ROM 12 and OTP NVM 11 are electrically connected to internal bus 19 and internal bus 19 is electrically connected to SRAM 13 for coupling data from ROM 12 and OTP NVM to SRAM 13.

Timing devices 1-4 of the present invention allow the customer to determine which configuration is used at power-on reset by providing input to configuration select input 16. In the event that no input is provided to configuration select input 16, the latch will register a logical low and the default configuration will be loaded into SRAM 13.

In the embodiments shown in FIGS. 1-4, timing device circuit 20 is shown to include a crystal oscillator 10 and a controller 26 that is operable for controlling the operation of the timing device circuit. Crystal oscillator 10 is programmable and can be coupled to an external timing device crystal such as an inexpensive fundamental-mode quartz crystal to provide timing device frequency synthesis. Timing device circuit 20 includes input 27, phase lock loop circuits 23 that are individually programmable to provide up to seven different frequencies, frequency dividers 24 and output driver 25 for generating at each timing device output 28 an output timing signal. Timing device circuit 20 also includes a plurality of additional inputs 21 and an input reference selector 22 that is coupled to each of the plurality of additional inputs 21 for selecting one or more of additional inputs 21 for use in generating one or more of the output timing signals.

It is appreciated that timing device circuit 20 may or may not include all of the features shown in FIGS. 1-4, depending on the intended use of timing device circuit 20. In one embodiment, additional inputs 21 and input reference selector 21, phase lock loops circuits 23 and frequency dividers 24 are optional and may or may not be included in timing device circuit 20, depending on the required timing device output. Also, other programmable features and non-programmable features may be included in timing device circuit 20 that are known in the art such as, for example, clock synthesizer circuits for generating programmed output frequencies, dynamic phase adjustment circuits for controlling the phase of one or more of the output timing signals relative to an input sync signal that may be received at, for example input 27 or one of inputs 21, voltage controlled oscillator circuits, SAW oscillator circuits, programmable loop bandwidth circuits, programmable slew rate control circuits, divider programming with FEC and DFEC look-up tables, frequency tuning circuits for tuning single or multiple frequencies by a VIN control pin, etc. In one specific embodiment timing device circuit 20 includes non-PLL fan-out buffers, clock synthesizers and muxes, single-ended timing device input to programmable differential timing device outputs, zero-delay buffers, programmable PLL bandwidth for device cascading, and jitter attenuators.

Figure 5:
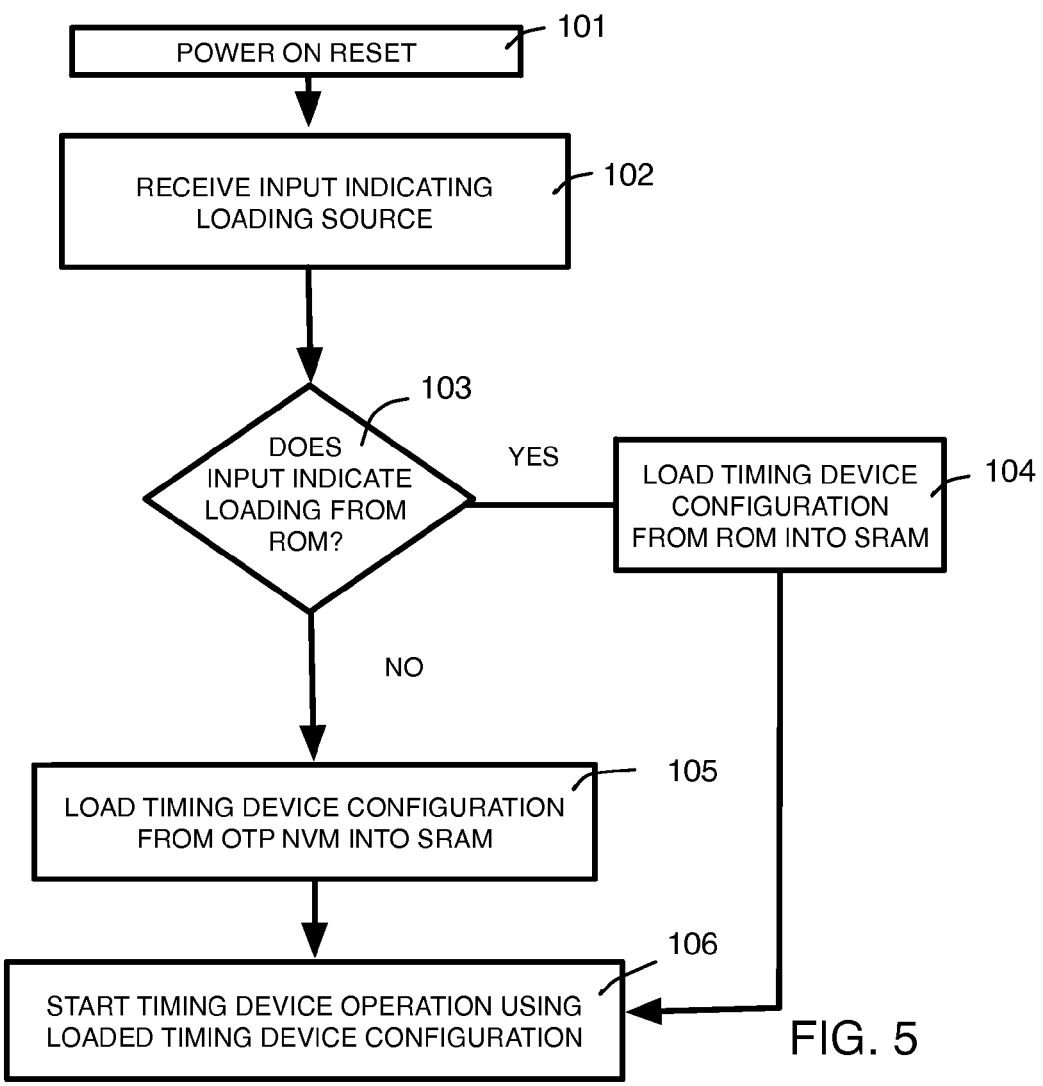
FIG. 5 is a block diagram illustrating a method for initiating operation of a timing device in accordance with an embodiment of the present invention.

FIG. 5 illustrates a method 100 for initiating operation of a timing device. In the present embodiment, prior to the power on reset of step 101, a first timing device configuration (e.g., a default timing device configuration) is stored in ROM and a second timing device configuration that is different from the first timing device configuration (e.g., a user-programmed timing device configuration) is stored OTP NVM 11.

Referring now to step 101, at power on reset of a timing device, input is received at the timing device indicating a loading source as shown by step 102. The input indicates either ROM is to be loaded or OPT NVM is to be loaded into a SRAM of the timing device. In the embodiment of FIGS. 1-4 the input is received at configuration select input 16 and is store in latch 15. The input may be, for example, a logical low indicating that SRAM is to be loaded from ROM 12 or a logical high indicating that SRAM 13 is to be loaded from OTP NVM 11.

As shown by steps 103-104 the timing device configuration from the ROM is loaded into a SRAM of the timing device when the input indicates ROM is to be loaded and the timing device configuration from the OTP NVM is loaded into the SRAM when the input indicates OTP NVM is to be loaded as shown by steps 103 and 105. More particularly, when the input indicates ROM is to be loaded, the default timing device configuration from ROM 12 is loaded into a SRAM 13 and when the input indicates OTP NVM is to be loaded the programmed timing device configuration from the OTP NVM is loaded into the SRAM 13.

Accordingly, only a single timing device configuration is loaded into SRAM 13 (the "loaded timing device configuration"). As shown by step 106 timing device operations are started using the loaded timing device configuration. In the present embodiment, operation of timing device circuit 20 is started using the loaded timing device configuration to generate output timing signals at timing device outputs 28.

Figure 6:
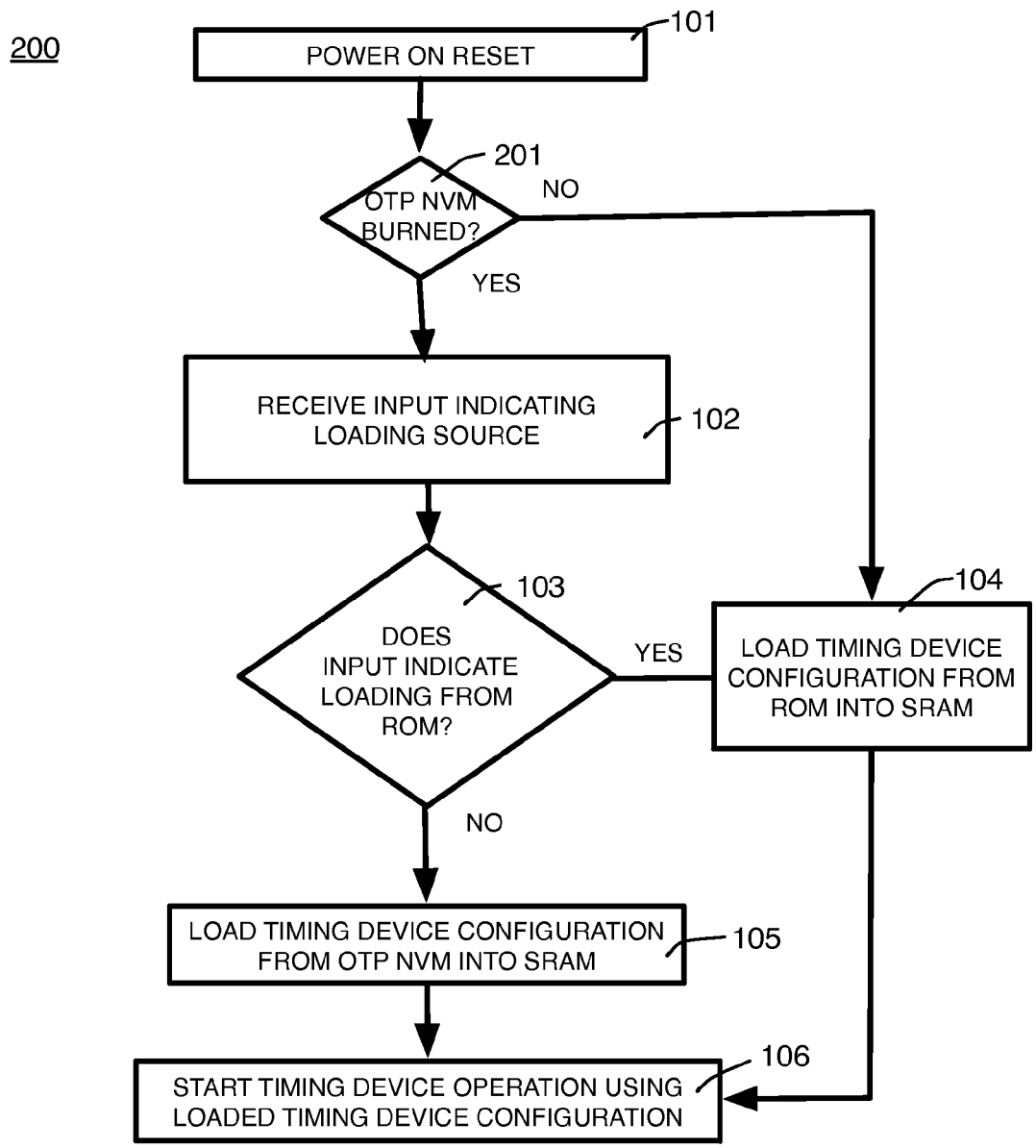
FIG. 6 is a block diagram illustrating a method for initiating operation of a timing device that includes determining whether the OTP NVM has been burned and loading the timing device configuration from ROM when the OTP NVM has not been burned in accordance with an embodiment of the present invention.

FIG. 6 shows a method for initiating timing device operation that includes at step 201 determining whether the OTP NVM has been burned and loading the first timing device configuration from the ROM into the SRAM when the OTP NVM has not been burned as shown by step 104. In the embodiment shown in FIG. 1 selection logic 14 is operable to determine whether the OTP NVM 11 has been burned, and is operable to only load SRAM 13 from ROM 12 when OTP NVM 11 has not been burned. Thereby the customer is prevented from the failure that would result from selecting OTP NVM when OTP NVM 11 has not yet been burned. More particularly, if OTP NVM is selected and no configuration is stored in OTP NVM, no configuration would be stored in SRAM 13, causing a failure of timing device 1.

Figure 3:
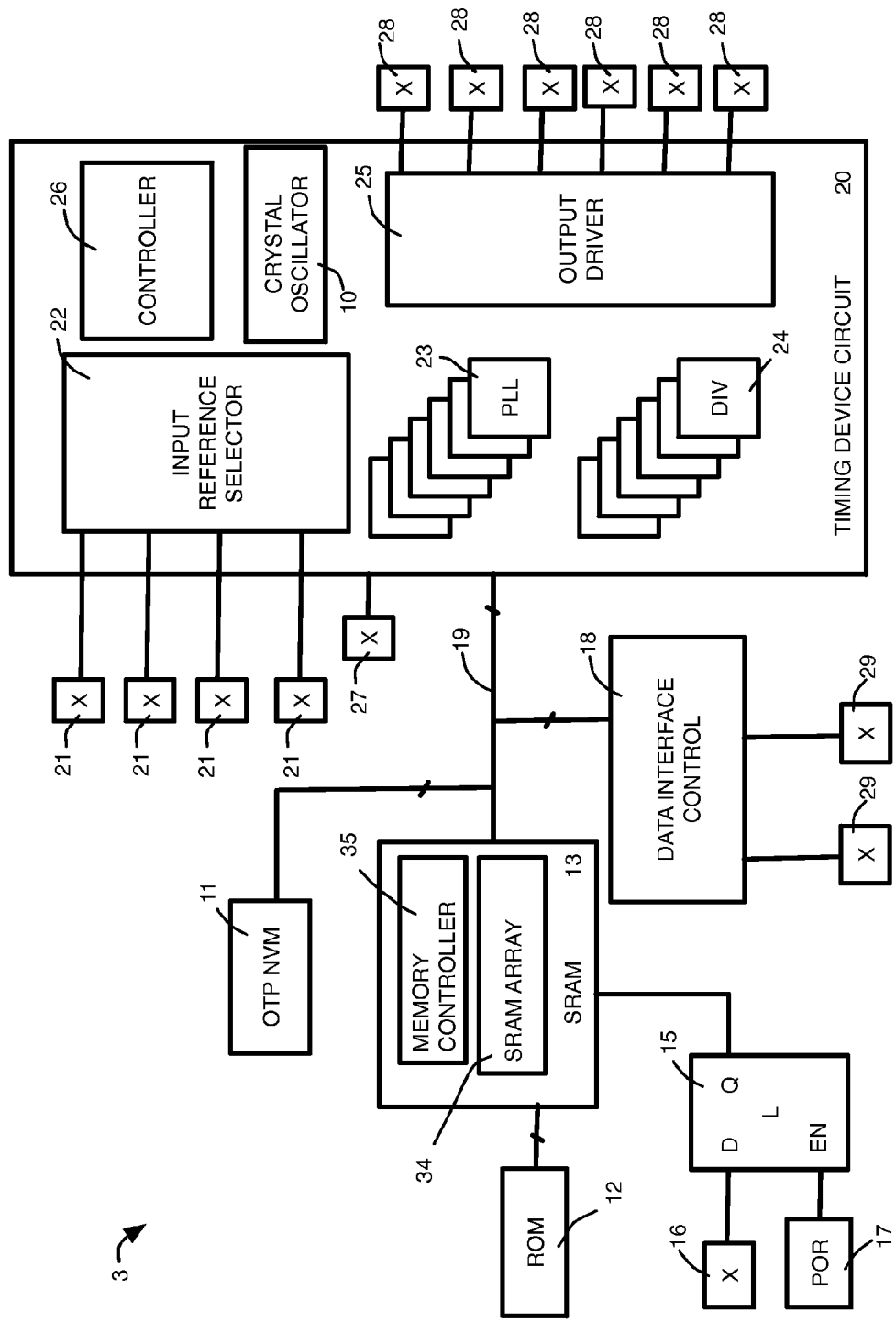
FIG. 3 is a block diagram illustrating a timing device having a SRAM that is coupled to a latch, ROM and to OTP NVM, with the OTP NVM coupled to the SRAM by a bus in accordance with an embodiment of the present invention.
Figure 4:
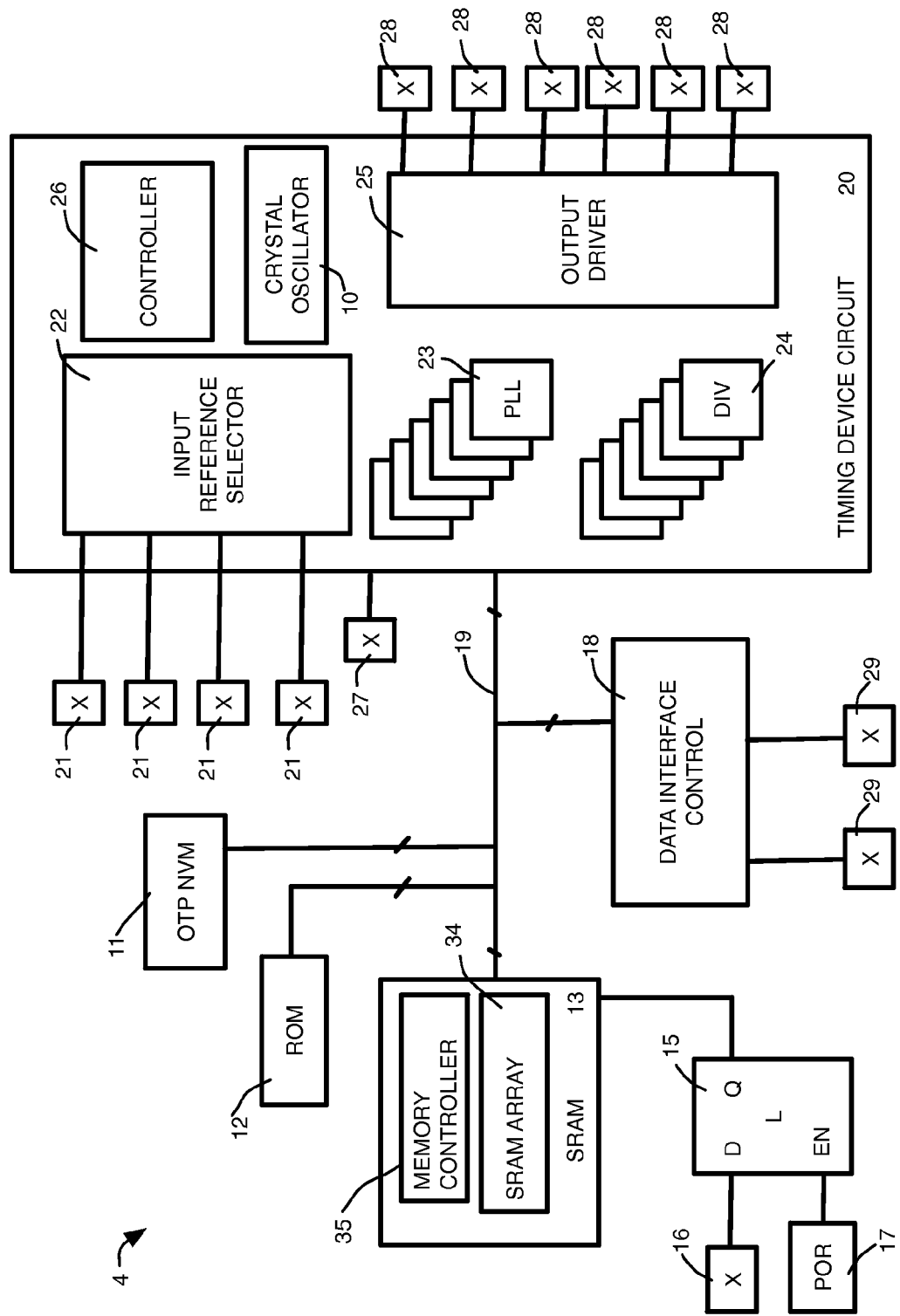
FIG. 4 is a block diagram illustrating a timing device having a SRAM that is coupled to a latch, ROM and to OTP NVM, with both the ROM and the OTP NVM coupled to the SRAM by a bus in accordance with an embodiment of the present invention.

In the embodiment shown in FIGS. 2-4, memory controller 35 is operable to determine whether the OTP NVM 11 has been burned, and is operable to only load SRAM 13 from ROM 12 when OTP NVM 11 has not been burned. Thereby the customer is prevented from the failure that would result from selecting OTP NVM when OTP NVM 11 has not yet been burned.

At step 106 of FIGS. 4-6, timing device operation is started using the loaded timing device configuration. As previously discussed, the loaded timing device configuration may be the default timing device configuration or the programmed timing device configuration. The loaded timing device configuration includes parameters for controlling the operation of timing device circuit 20.

It is appreciated that programmable timing device circuit 20 can have any of a number of different designs and may be specialized for any of a number of different purposes. In one embodiment the loaded timing device configuration includes skew parameters for controlling skew of one or more of the plurality of output timing signals. The loaded timing device configuration can also include output frequency parameters for controlling the frequency of the plurality of output timing signals. Moreover, the loaded timing device configuration can include output format parameters for controlling the output format of the output timing signals. The output format parameters can indicate, for example LVPECL, LVDS, HCSL, CML, HSTL, or other selectable outputs. The loaded timing device configuration also includes parameters for controlling one or more of phase lock loop circuits 23, parameters for controlling one or more of frequency dividers 24 and parameters for selecting one or more of the additional inputs 21.

Figure 7:
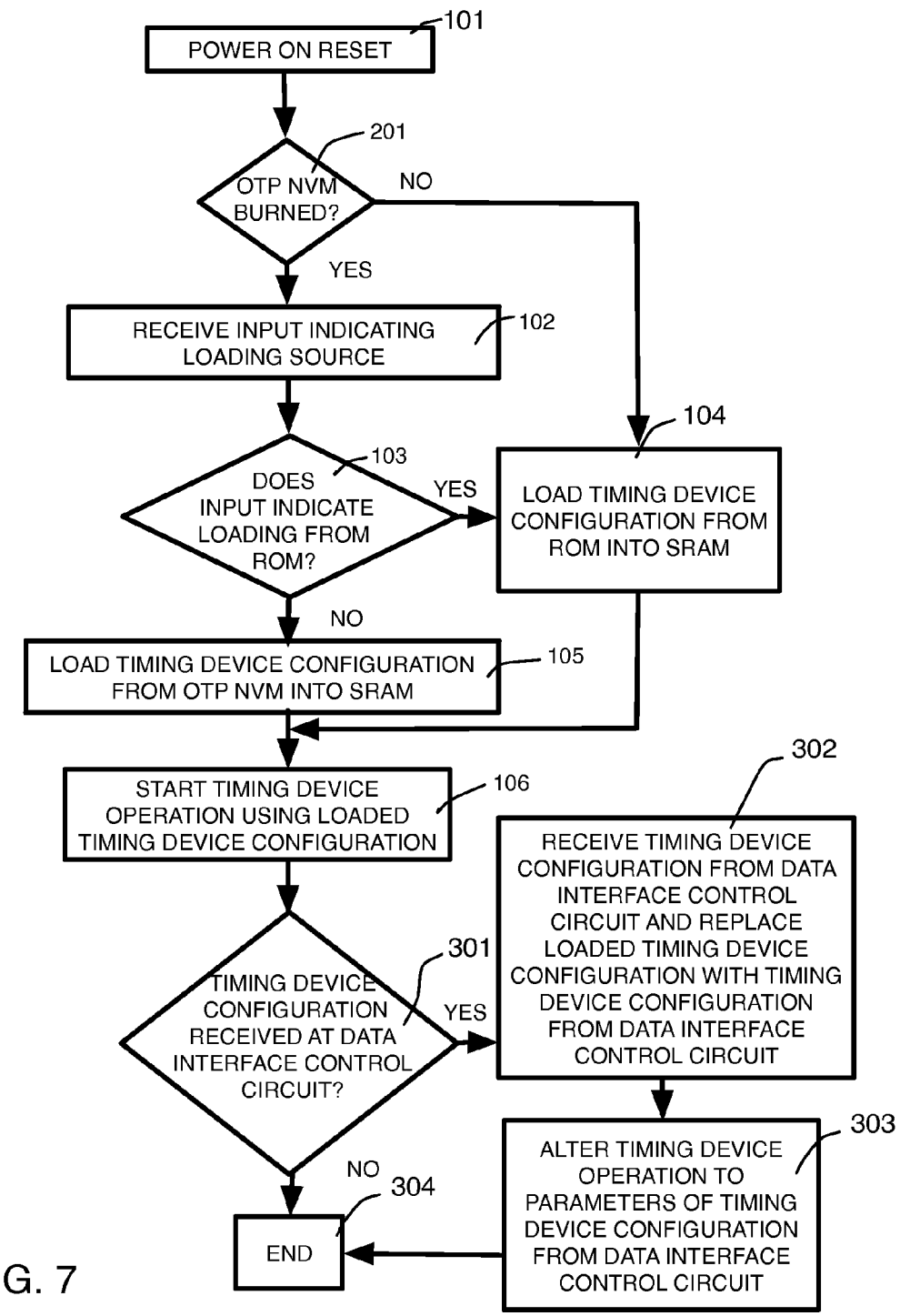
FIG. 7 is a block diagram illustrating a method for initiating operation of a timing device that allows timing device configurations received at a data interface control circuit to be loaded into the SRAM in accordance with an embodiment of the present invention.

It is appreciated that there may be a need to load a different timing device configuration into SRAM from the timing device configuration stored in ROM 12 and OTP NVM or load changes to the loaded timing device configuration. FIG. 7 illustrates an embodiment in which a timing device configuration or changes to a loaded timing device configuration can be sent to the interface control circuit after power on reset for loading into the SRAM. As in the previous embodiments, as shown by steps 101-106 and 201, the timing device configuration from either the ROM or the from the OTP NVM is loaded into a SRAM of the timing device and timing device operations are started using the loaded timing device configuration. In the present embodiment, operation of timing device circuit 20 is started using the loaded timing device configuration to generate output timing signals at timing device outputs 28.

As shown by step 301-302, when timing device configuration input that includes a new timing device configuration is received at an interface control circuit immediately after power-on reset, the loaded timing device configuration (loaded in step 104 or 105) is replaced with the timing device configuration received at the data interface control circuit. The operation of the timing device circuit is then altered to correspond to the parameters in the timing device configuration received at the data interface control circuit as shown by step 303.

In the present embodiment, timing device 1 is an Application-Specific Integrated Circuit (ASIC) formed on a single semiconductor die. Accordingly, the timing device circuit 20, the SRAM 13, ROM 12, the OTP NVM 11 and selection logic 14 are disposed on a single semiconductor die. Also, in the present embodiment timing devices 2 and 3 are ASICS formed on a single semiconductor die.

As is known in the art, the methods and apparatus of the present invention may be implemented in a Field Programmable Gate Array (FPGA), an Application-Specific Integrated Circuit (ASIC) or a variety of other commonly known integrated circuit devices. The implementation of the invention may include both hardware and software components. For example processes, actions and steps described in the present application can be performed by instructions performed on controller 26 and/or memory controller 35 such as, for example, one or more of the steps of methods 100, 200 and 300. Similarly, one or more of the steps of methods 100, 200 or 300 could be preformed using instructions that are performed by memory controller 35.

The methods and apparatus of the present invention allow for loading a configuration from either ROM or OTP NVM, providing the user of the timing device added flexibility as compared to timing devices that only allow for loading a timing device configuration from ROM and timing devices that only allow for loading of timing device configurations received at data interface control circuits.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:
1. A timing device comprising:
a timing device circuit for generating at least one timing signal;
a static random access memory (SRAM) coupled to the timing device circuit;
a read only memory (ROM) having a first timing device configuration stored therein;
a one time programmable non volatile memory (OTP NVM) for storing a second timing device configuration; and
selection logic having an output coupled to the SRAM and having a first input coupled to the ROM and a second input coupled to the OTP NVM, the selection logic operable to receive input indicating whether the SRAM is to be loaded from the ROM or the OTP NVM, and operable to load either the first timing device configuration from the ROM or the second timing device configuration from the OTP NVM based on the input.

2. The timing device of claim 1 wherein the selection logic is operable to determine whether the OTP NVM has been burned, the selection logic operable to only load the SRAM from the ROM when the OTP NVM has not been burned.

3. The timing device of claim 2 wherein the ROM, the SRAM, the OTP NVM, the selection logic and the timing device circuit are formed on a single semiconductor die.

4. The timing device of claim 3 wherein the second timing device configuration is stored in the OTP NVM by burning the OTP NVM, the selection logic operable to load the first timing device configuration from the ROM or the second timing device configuration from the OTP NVM into the SRAM based on the input.

5. The timing device of claim 4 further comprising a data interface control circuit coupled to the SRAM and coupled to the timing device, the data interface control circuit operable to receive timing device configuration input that includes a third timing device configuration and operable upon receiving the timing device configuration input to replace the loaded timing device configuration with the third timing device configuration.

6. The timing device of claim 4 wherein the timing device circuit includes a plurality of additional inputs and an input reference selector that is coupled to each of the plurality of additional inputs, the input reference selector operable for selecting one or more of the plurality of additional inputs in accordance with parameters specified in the loaded timing device configuration.

7. The timing device of claim 3 wherein the timing device circuit includes a plurality of phase lock loop circuits that are controlled by parameters specified in the loaded timing device configuration and at least one frequency divider that is controlled by parameters specified in the loaded timing device configuration.

8. The timing device of claim 1 wherein the selection logic comprises a multiplexer having an output coupled to the data input of the SRAM, a first input of the multiplexer coupled to the data output of the ROM and a second input of the multiplexer coupled to the data output of the OTP NVM.

9. A method comprising:
receiving an input at a timing device, the input indicating either read only memory (ROM) is to be loaded or one time programmable non volatile memory (OTP NVM) is to be loaded into a static random access memory (SRAM) of the timing device;
storing a first timing device configuration in a ROM of the timing device;
loading the first timing device configuration from the ROM into the SRAM of the timing device when the input indicates ROM is to be loaded;
when a second timing device configuration is stored in a OTP NVM of the timing device and when the input indicates OTP NVM is to be loaded, loading the second timing device configuration from the OTP NVM into the SRAM, the second timing device configuration different from the first timing device configuration; and
starting timing device operations using the loaded timing device configuration to generate output timing signals.

10. The method of claim 9 further comprising:
determining whether the OTP NVM has been burned; and
loading the first timing device configuration into the SRAM when the OTP NVM has not been burned.

11. The method of claim 10 wherein the loaded timing device configuration includes skew parameters for controlling skew of one or more of the plurality of output timing signals.

12. The method of claim 10 wherein, the loaded timing device configuration includes output frequency parameters for controlling the frequency of the plurality of output timing signals.

13. The method of claim 10 wherein, the loaded timing device configuration includes output format parameters for controlling the output format of the output timing signals.

14. The method of claim 10 further comprising:
when timing device configuration input data is received at a data interface control circuit that includes a third timing device configuration replacing the loaded timing device configuration with the third timing device configuration.

15. A timing device comprising:
a timing device circuit for generating at least one timing signal:
a read only memory (ROM) having a first timing device configuration stored therein;
a one time programmable non volatile memory (OTP NVM) for storing a second timing device configuration; and
a static random access memory (SRAM) coupled to the timing device circuit, the ROM, the OTP NVM and a configuration select input, the SRAM including a SRAM array and a memory controller that is coupled to the SRAM array, the memory controller operable to receive input indicating whether the SRAM is to be loaded from the ROM or the OTP NVM and operable to load either the first timing device configuration from the ROM or the second timing device configuration from the OTP NVM into the SRAM memory array based on the input.

16. The timing device of claim 15 wherein the memory controller is operable to determine whether the OTP NVM has been burned, to load the first timing device configuration from the ROM when the OTP NVM has not been burned.

17. The timing device of claim 16 further comprising a data interface control circuit coupled the SRAM and coupled to the timing device circuit, the data interface control circuit operable to receive timing device configuration input that includes a third timing device configuration and operable upon receiving the timing device configuration input to replace the loaded timing device configuration with the third timing device configuration.

18. The timing device of claim 16 wherein the timing device circuit includes a plurality of phase lock loop circuits that are controlled by parameters specified in the loaded timing device configuration and at least one frequency divider that is controlled by parameters specified in the loaded timing device configuration.

19. The timing device of claim 15 wherein the timing device circuit, the SRAM, the ROM and the OTP NVM are formed on a single semiconductor die.

20. The timing device of claim 15 further comprising a latch coupled to the configuration select input for receiving the input indicating whether the SRAM is to be loaded from the ROM or the OTP NVM, the latch having an output coupled to the SRAM.

* * * * *